(12) United States Patent
Numano et al.

(10) Patent No.: US 8,820,614 B2
(45) Date of Patent: Sep. 2, 2014

(54) MAGNESIUM ALLOY JOINED PART AND PRODUCTION METHOD THEREOF

(75) Inventors: Masatada Numano, Osaka (JP);
Ryuichi Inoue, Itami (JP); Nobuyuki Okuda, Itami (JP); Nozomu Kawabe, Osaka (JP); Koji Mori, Itami (JP); Nobuyuki Mori, Itami (JP); Yukihiro Oishi, Osaka (JP); Takahiko Kitamura, Itama (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 2 days.

(21) Appl. No.: 13/352,029

(22) Filed: Jan. 17, 2012

(65) Prior Publication Data

US 2012/0111484 A1  May 10, 2012

Related U.S. Application Data

(62) Division of application No. 13/142,360, filed as application No. PCT/JP2009/069460 on Nov. 17, 2009.

(30) Foreign Application Priority Data

Dec. 26, 2008 (JP) ................................. 2008-334669

(51) Int. Cl.
  *B23K 31/02*   (2006.01)
  *B29C 65/00*   (2006.01)
  *B31B 1/62*    (2006.01)
  *H05K 5/04*    (2006.01)

(52) U.S. Cl.
  CPC ........................................ *H05K 5/04* (2013.01)
  USPC ........................... 228/155; 228/262.5; 156/60

(58) Field of Classification Search
  None
  See application file for complete search history.

(56) References Cited

U.S. PATENT DOCUMENTS 2,023,498 A * 12/1935 Winston ......................... 228/158
3,148,952 A *  9/1964 Foerster et al. ............... 428/649

(Continued)

FOREIGN PATENT DOCUMENTS

CN        1723095        1/2006
GB        2134833 A *    8/1984

(Continued)

OTHER PUBLICATIONS

Translation of JP-60-37281A (no date available).*

(Continued)

*Primary Examiner* — Kiley Stoner
(74) *Attorney, Agent, or Firm* — McDermott Will & Emery LLP (57) ABSTRACT

The method of producing a magnesium alloy joined part has the following steps: a joining step of joining a reinforcing material made of metal to a plate material made of magnesium alloy without allowing an organic material to remain at the joined portion and a plastic-working step of performing plastic working on the plate material to which the reinforcing material is joined. A desirable means of joining the reinforcing material to the plate material can be to use an inorganic adhesive. Because the magnesium alloy joined part is formed by a structure in which the reinforcing material is joined to the plate material, in comparison with the case where the reinforcing material is formed by machining or the like, the magnesium alloy structural member can be obtained with high production efficiency.

8 Claims, 2 Drawing Sheets

(56) References Cited

U.S. PATENT DOCUMENTS

| | | | |
|---|---|---|---|
| 4,367,838 A * | 1/1983 | Yoshida | 228/114.5 |
| 4,608,087 A * | 8/1986 | Yoshino et al. | 106/18.12 |
| 4,608,097 A * | 8/1986 | Weinberger et al. | 438/703 |
| 4,613,069 A * | 9/1986 | Falke et al. | 228/211 |
| 5,806,752 A * | 9/1998 | Van Evans et al. | 228/183 |
| 6,770,812 B2 * | 8/2004 | Kimura et al. | 174/521 |
| 6,979,161 B2 * | 12/2005 | Ando et al. | 411/368 |
| 7,523,554 B2 * | 4/2009 | Kimura et al. | 29/894.353 |
| 2002/0127083 A1 * | 9/2002 | Ando et al. | 411/378 |
| 2003/0162046 A1 * | 8/2003 | Kimura et al. | 428/556 |
| 2003/0168496 A1 * | 9/2003 | Shinkai et al. | 228/180.21 |
| 2005/0150577 A1 * | 7/2005 | Suzuki et al. | 148/420 |
| 2005/0179010 A1 * | 8/2005 | Lin | 252/387 |
| 2007/0039829 A1 * | 2/2007 | Pearson et al. | 205/177 |
| 2007/0169858 A1 * | 7/2007 | Oishi et al. | 148/667 |
| 2007/0169859 A1 * | 7/2007 | Kawamura et al. | 148/667 |
| 2008/0075624 A1 * | 3/2008 | Sakai et al. | 420/408 |
| 2008/0138729 A1 * | 6/2008 | Makino et al. | 430/64 |
| 2009/0068492 A1 * | 3/2009 | Fujii et al. | 428/615 |
| 2009/0090479 A1 * | 4/2009 | Westengen et al. | 164/113 |
| 2009/0127319 A1 * | 5/2009 | Ho | 228/209 |
| 2010/0089976 A1 * | 4/2010 | Szymanski et al. | 228/113 |
| 2010/0163141 A1 * | 7/2010 | Shoji et al. | 148/667 |
| 2010/0254848 A1 * | 10/2010 | Inoue et al. | 420/408 |
| 2011/0089977 A1 * | 4/2011 | Hunter et al. | 327/65 |
| 2011/0214799 A1 * | 9/2011 | Szymanski et al. | 156/73.5 |
| 2011/0229733 A1 | 9/2011 | Numano | |

FOREIGN PATENT DOCUMENTS

| | | | |
|---|---|---|---|
| JP | 60-37281 A * | 2/1984 | |
| JP | 60-221190 A * | 11/1985 | |
| JP | 61-119373 A * | 6/1986 | |
| JP | 06-182743 A | 7/1994 | |
| JP | 08-029264 A | 2/1996 | |
| JP | 09-057435 A * | 3/1997 | |
| JP | 09-253504 A | 9/1997 | |
| JP | 10-279887 | 10/1998 | |
| JP | 10-279887 A * | 10/1998 | |
| JP | 2002-018626 | 1/2002 | |
| JP | 2003-258445 | 9/2003 | |
| JP | 2007-050424 | 3/2007 | |
| JP | 2007-50424 A * | 3/2007 | |
| JP | 2007-098470 | 4/2007 | |
| WO | 2004/052573 | 6/2004 | |
| WO | WO 2006/003899 A1 | 1/2006 | |

OTHER PUBLICATIONS

US Office Action issued in U.S. Appl. No. 13/142,360 dated Apr. 12, 2012.

United States Office Action issued in U.S. Appl. No. 13/142,360, mailed Mar. 2, 2012.

Japanese Office Action, and partial English translation, issued in Japanese Patent Application No. 2008-334669 dated Jul. 5, 2012.

Chinese Office Action, and English translation, issued in Chinese Patent Application No. 200980152162.4 dated Aug. 22, 2013.

* cited by examiner

MAGNESIUM ALLOY JOINED PART AND PRODUCTION METHOD THEREOF

RELATED APPLICATIONS

This application is a Divisional of U.S. application Ser. No. 13/142,360, filed on Jun. 27, 2011, which is the U.S. National Phase under 35 U.S.C. §371 of International Application No. PCT/JP2009/069460, filed on Nov. 17, 2009, which in turn claims the benefit of Japanese Application No. 2008-334669, filed on Dec. 26, 2008, the disclosures of which Applications are incorporated by reference herein.

TECHNICAL FIELD

The present invention relates to a magnesium alloy joined part and a production method thereof. In particular, the present invention relates to a method of producing a magnesium alloy joined part that enables the joining of a reinforcing material to a base material with high productivity.

BACKGROUND ART

Magnesium alloy, which is lightweight and high in specific strength, has been used for the housing case of mobile devices, such as a cellular phone and a notebook personal computer, and a structural material for an automobile's parts and the like. In particular, in recent years, the market has been requiring a magnesium alloy joined part to be thin to further reduce its weight. The thinning of a magnesium alloy joined part, however, results in a decrease in its rigidity. To prevent this decrease, it becomes necessary to provide a reinforcing material.

To provide a magnesium alloy base material with a reinforcing material, it is conceivable to form, by machining, the reinforcing material as a body unified with the base material (Patent Literature 1). It is also conceivable to join the reinforcing material to the base material. The concrete means of the joining include a means of bonding a reinforcing material to the base material with an organic adhesive sheet.

SUMMARY OF INVENTION

Technical Problem

Despite the above description, in the forming of a reinforcing material by machining, a large amount of magnesium alloy is removed by machining, so that the production efficiency is decreased. In addition, the production and scattering of the chips should be avoided in terms of environment and safety.

On the other hand, in the joining by the use of an organic adhesive sheet, at the time of the recycling of a magnesium alloy joined part, the melting of the joined part, for example, generates a hazardous gas and smoke and soot, thereby creating a problem in terms of environment. In particular, when a reinforcing material is joined to a press-formed body having various shapes formed by pressing a plate material, because the press-formed body has various shapes, it is difficult to perform the joining of the reinforcing material stably.

In light of the foregoing circumstances, the present invention is made. An object of the present invention is to offer a method of producing a magnesium alloy joined part that enables the joining of a reinforcing material to a base material with high productivity.

Another object of the present invention is to offer a magnesium alloy joined part that does not generate a hazardous gas, smoke and soot, or the like at the time of the recycling and a production method thereof.

Yet another object of the present invention is to offer a method of producing a magnesium alloy joined part that enables the stable and reliable joining of a reinforcing material to an object to be joined.

Solution to Problem

The method of the present invention for producing a magnesium alloy joined part has the following steps:

(a) a joining step of joining at least one member selected from the group consisting of a reinforcing material, a boss, and a pin, all made of metal, to a rolled plate made of magnesium alloy without allowing an organic material to remain at the joined portion; and (b) a plastic-working step of performing plastic working on the rolled plate having undergone the joining step;

wherein the joining is performed by forming a joining layer composed of an inorganic adhesive composed mainly of aluminum oxide.

According to this method, because the magnesium alloy joined part is formed by a structure in which a reinforcing material is joined to a rolled plate, in comparison with the case where the reinforcing material is formed by machining or the like, the magnesium alloy joined part can be obtained with high production efficiency. Because the reinforcing material is joined to the rolled plate without allowing an organic material to remain, no hazardous gas and smoke and soot are generated when the magnesium alloy joined part is recycled. Furthermore, because the object to which the reinforcing material is joined is limited to a rolled plate, in comparison with the case where the reinforcing material is joined to a joined part having a complicated shape, the joining operation of the reinforcing material can be performed stably and reliably.

In the method of the present invention for producing a magnesium alloy joined part, it is desirable that the rolled plate contain Al at a content of 1.0 mass % or more and 11 mass or less.

A rolled plate having this composition has excellent corrosion resistance and mechanical properties such as strength and plastic-deformation resistance.

In the method of the present invention for producing a magnesium alloy joined part, it is desirable that the difference in thermal expansion coefficient between the reinforcing material and the rolled plate be $10 \times 10^{-6}$/K or less.

According to this system, because the difference in thermal expansion coefficient between the reinforcing material and the rolled plate is small, the following problems can be suppressed from being created. One problem is the deformation of the reinforcing material resulting from the heating in the joining step or the like. The deformation renders it difficult to perform the joining at a proper position. The other problem is caused by the expansion due to the heating at the time of joining and the contraction after the joining. The contraction creates a large strain in the magnesium alloy joined part.

In the method of the present invention for producing a magnesium alloy joined part, the joining step can include the performing of heat treatment in which the joined portion is heated at 80° C. or more and 350° C. or less.

According to this method, even when the joining layer contains an organic solvent or water, they can be removed. As a result, a joining layer composed practically of an inorganic material can be easily formed.

The magnesium alloy joined part of the present invention is obtained through the above-described method of the present invention for producing a magnesium alloy joined part.

According to this method, because no organic material is used, the generation of a hazardous gas or smoke and soot can be prevented at the time of the recycling of the magnesium alloy joined part.

Advantageous Effect of Invention

The method of the present invention for producing a magnesium alloy joined part forms the magnesium alloy joined part through a structure of joining a reinforcing material to a rolled plate. Consequently, a magnesium alloy joined part can be obtained with high production efficiency.

The magnesium alloy joined part of the present invention does not generate a hazardous gas or smoke and soot at the time of the recycling.

DESCRIPTION OF EMBODIMENTS

An explanation is given below to embodiments of the present invention. In the explanation of the drawing, the same element bears the same sign to eliminate duplicated explanations. The ratio of the dimensions in the drawing does not necessarily coincide with that of the explanation.

Object to be Joined

In the present invention, the types of objects to be joined include a plate material and a reinforcing material.

Plate Material

The plate material is a flat plate-shaped part. Because the plate material has the shape of a flat plate, the reinforcing material can be easily joined to it stably and firmly. When the joining surface of the plate material is a curved surface, a sophisticated processing technique is required to match the curved condition of the joining surface of the reinforcing material to that of the plate material. In contrast, when the plate material has the shape of a flat plate, the reinforcing material can have a flat joining surface. Consequently, both the plate material and the reinforcing material can be obtained relatively easily.

The thickness of the plate material is not particularly limited. Nevertheless, it is desirable that the thickness be 2.0 mm or less, particularly 1.5 mm or less, more desirably 1.0 mm or less. In the above-described range, the thicker plate material has higher strength and the thinner plate material is more suitable for a thin, lightweight housing case. The thickness of the plate material can be selected according to the purpose of the magnesium alloy joined part.

It is undesirable for the plate material to have a length excessively longer than that of the reinforcing material. In particular, when the longitudinal length of the reinforcing material is denoted as Lr and the length of the plate material in a direction along the reinforcing material is denoted as Lb, it is desirable that the ratio of the lengths of the two materials, Lr/Lb, be 0.8 or more. When a reinforcing material is joined to an extremely small part of a broad plate material, the effect of the function of reinforcement is negligible. Consequently, in order to reinforce a plate material with a reinforcing material, it is necessary to join the reinforcing material to the plate material across a wide area to some extent. To meet this requirement, when the above-described ratio Lr/Lb has a value of 0.8 or more, the reinforcing material can exert sufficient function of reinforcement to increase the rigidity of the plate material. Of course, the joining surfaces of the plate material and the reinforcing material may be joined together locally. Nevertheless, it is desirable to join the entire surfaces.

When the plate material itself has a large size to a certain extent, the necessity of joining the reinforcing material is high. When the plate material is small, the necessity of reinforcing it is low. Consequently, when the plate material has a length of 10 cm or more, the effectiveness of joining the reinforcing material is high.

In the present invention, the above-described plate material is specified to be composed of magnesium alloy. The magnesium alloy can have a varied composition including an element added to Mg (the remainder: Mg and impurities). The types of magnesium alloy include, for example, an Mg—Al-based alloy, Mg—Zn-based alloy, Mg-RE (rare-earth element)-based alloy, and Y-added alloy. In particular, an Mg—Al-based alloy, which contains Al, has high corrosion resistance. The types of Mg—Al-based alloy include, for example, as in the Standards of American Society for Testing and Material (ASTM), AZ-family alloy (Mg—Al—Zn-based alloy, Zn: 0.2 to 1.5 mass %), AM-family alloy (Mg—Al—Mn-based alloy, Mn: 0.15 to 0.5 mass %), AS-family alloy (Mg—Al—Si-based alloy, Si: 0.6 to 1.4 mass %), and Mg—Al-RE (rare-earth element)-based alloy. It is desirable that the Al content be 1.0 to 11 mass %. It is particularly desirable to use an Mg—Al-based alloy that contains Al at 8.3 to 9.5 mass % and Zn at 0.5 to 1.5 mass % with the remainder composed of Mg and impurities. AZ91 alloy, which is a representative example of the foregoing Mg—Al-based alloy, has excellent corrosion resistance and mechanical properties such as strength and plastic-deformation resistance in comparison with AZ31 alloy and other Mg—Al-based alloys.

Because AZ91 described above has excellent corrosion resistance, when it is used for a joined part at a location unexposed to the outside, such as a joined part placed at the inner surface of a housing case and a joined part housed in the housing case, the joined part s are sometimes allowed to be used without painting or without being provided with an anticorrosion coating. When no painting or anticorrosion coating is formed, their forming processes can be omitted. In addition, when no painting or the like is provided, an organic solvent, which is usually included in the paint or the like, does not exist either. Consequently, when a magnesium alloy joined part is recycled, the generation of a hazardous gas and smoke and soot can be suppressed. The types of anticorrosion coating include a chemically converted film and an anodized coating.

In addition, the production process of the plate material is not particularly limited. Both of a cast plate and a rolled plate can be used. When a cast plate is used, it is desirable to use a cast plate produced by a continuous-casting process such as a twin-roll casting process, particularly the casting process stated in WO 2006/003899. When a rolled plate is used, it is desirable to use a rolled plate produced by the rolling process stated in the published Japanese patent application Tokukai 2007-98470, for example. In the following, a rolled plate is used as the plate material.

Reinforcing Material

Figure 1A:
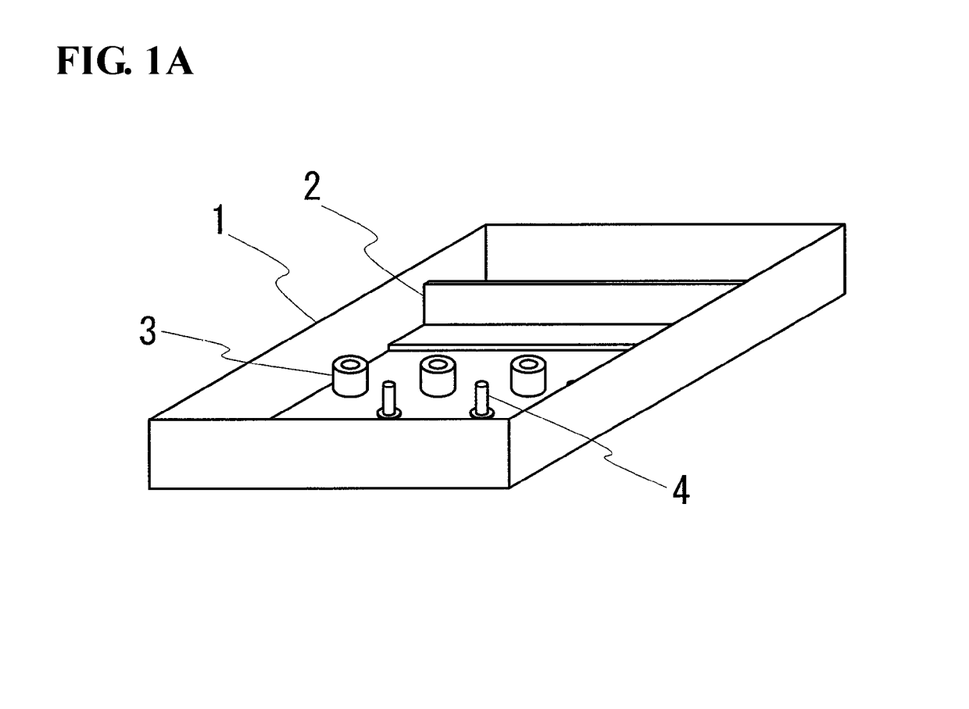
FIG. 1A is a perspective view showing the magnesium alloy joined part in an embodiment of the present invention.
Figure 1B:
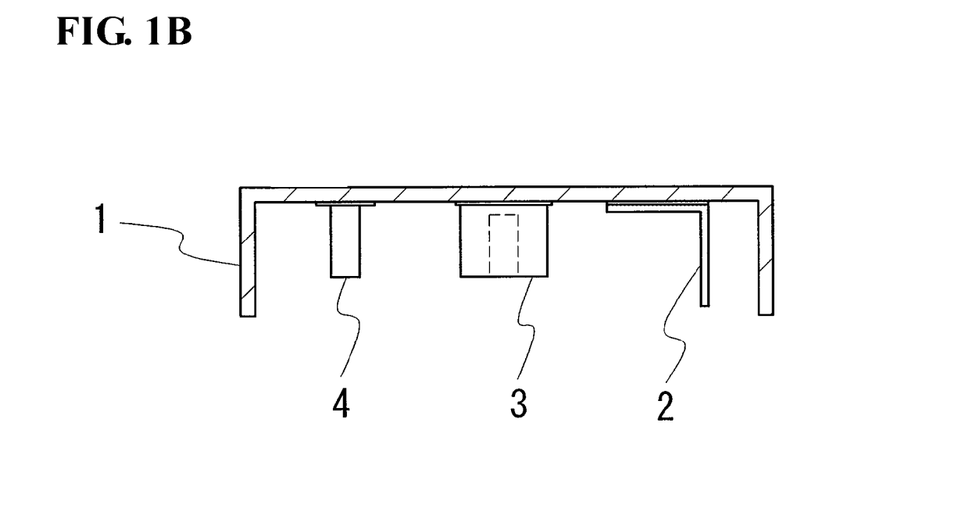
FIG. 1B is a cross-sectional view showing the magnesium alloy joined part in an embodiment of the present invention.

As shown in FIGS. 1A and 1B, a reinforcing material 2 exercises its function of reinforcing a plate material 1 by being joined to the plate material 1. The shape of the reinforcing material 2 is required only to have an ability to reinforce the plate material 1 and therefore is not particularly limited. Theoretically, a flat plate-shaped reinforcing material may be surface-joined to the plate material. Practically, it is desirable, however, to use a reinforcing material 2 having the shape in which a protruding portion protrudes in a direction perpendicular to the plate material. Typical examples include a long material having an L-shaped cross section as shown in FIG. 1B and T- and I-shaped long materials. In particular, in a state in which a reinforcing material is joined to a plate material, it is desirable that the reinforcing material have a shape that has a portion in which the height of the reinforcing material protruding from the surface of the plate material is at least two times the thickness of the plate material. Generally, one operation, such as the forging of a plate material, alone practically cannot form on the plate material a protruding portion that has a height at least two times the thickness of the plate material. Even when a low protruding portion is formed by the forging, the portion of the plate material around the protruding portion becomes thin locally. On the other hand, the present invention allows free selection of the height of the reinforcing material. Consequently, by joining a reinforcing material having a height at least two times the thickness of a plate material, high reinforcing performance can be achieved. Of course, no thinning occurs at the portion of the plate material around the reinforcing material.

In all cases of a flat plate-shaped reinforcing material and reinforcing materials having T-, L-, and I-shaped cross section, a suitable through hole may be formed as required in at least one of the joining portion to be joined to the plate material and the protruding portion to such an extent that the strength of the reinforcing material can be maintained. The formation of the through hole enables the weight reduction of the reinforcing material. The through hole can also be used as a screw hole.

The present invention specifies that the reinforcing material is made of metal. By using the reinforcing material made of metal, the plate material made of magnesium alloy can be sufficiently reinforced. More specifically, in order to maintain the feature of lightweight of the plate material, it is desirable to use a light metal such as magnesium alloy or aluminum alloy. In addition, titanium alloy and the like can also be used as the material of the reinforcing material.

It is desirable that the material of the reinforcing material have a difference of $10 \times 10^{-6}$/K or less in thermal expansion coefficient from that of the plate material. Furthermore, when the joined part to be joined has a length of 100 mm or more, it is more desirable that the difference in thermal expansion coefficient be $5 \times 10^{-6}$/K or less. When the reinforcing material is formed by using a material having a large difference in thermal expansion coefficient from that of the plate material, the reinforcing material is expanded by the heating in a joining step or the like. This expansion creates problems such as rendering the joining at a proper position difficult. On the other hand, when a plate material and a reinforcing material having a small difference in thermal expansion coefficient between the two materials are selected, the joining operation between the two materials can be performed easily. For example, the difference in thermal expansion coefficient is large between magnesium alloy and aluminum or aluminum alloy. In contrast, the difference in thermal expansion coefficient is relatively small between the magnesium alloys specified in ASTM. When the plate material and reinforcing material are formed of alloy, it is desirable that the base metals be the same. In particular, it is more desirable that the plate material and reinforcing material have practically the same compositions. When the plate material and reinforcing material have practically the same compositions, electrolytic corrosion is less likely to occur at the joined portion.

The production process of the reinforcing material may be any process of casting, rolling, extrusion, drawing, and so on. Of course, the reinforcing material may be a rolled plate produced by rolling a cast material, a rolled plate produced by rolling an extruded material, an extruded material produced by extruding a cast material, or a drawn material produced by drawing a cast material.

For the arranging pattern of the reinforcing materials on the plate material, it is desirable that long reinforcing materials be joined to the plate material continuously in the direction of the length of the plate material. When a plurality of short reinforcing materials are joined to the plate material with spacing, the reinforcing effect is low. On the other hand, when long reinforcing materials are joined to the plate material continuously, good reinforcing performance can be achieved.

Joining Step

A joining step is a step of joining the reinforcing material to the plate material. The reinforcing material is joined to a plate material before the plate material undergoes the below-described plastic-working step. Consequently, the object to which the reinforcing material is joined has the shape of a flat plane and therefore the reinforcing material can be joined to the plate material stably and reliably.

In the joining step, the foregoing joining is performed such that an organic material does not remain. The present invention specifies that the types of organic material include not only an organic adhesive but also an adhesive sheet having both an organic adhesive and a plastic sheet. Because an organic material does not remain, at the time the magnesium alloy joined part obtained through the production method of the present invention is recycled, even when the joined part is melted, the generation of a hazardous gas and smoke and soot can be avoided. The types of joining that does not allow the organic material to remain include a joining in which an organic material is not included in the material to be used for the joining and a joining in which although an organic material is included in the material to be used for the joining, the organic material is removed. The concrete examples of the former case of joining include hot cladding and welding. The concrete examples of the latter case of joining include a joining in which, first, the joining between a plate material and a reinforcing material is conducted by using an inorganic adhesive containing an organic solvent and, then, after the joining, the organic solvent is removed. In addition, in the production method of the present invention, the joining that does not allow the organic material to remain can also be classified into a joining that is performed by placing a joining layer composed of inorganic material between the plate material and reinforcing material and a joining that is performed by directly joining the plate material and reinforcing material. The concrete examples of the former case of joining include a joining performed by using the above-described inorganic adhesive and hot cladding. The concrete examples of the latter case of joining include welding. It is desirable that the joining layer composed of the foregoing inorganic material be formed of a material different from at least one of the plate material and the reinforcing material.

Inorganic Adhesive

The types of inorganic adhesive include adhesives containing Al and Si. More specifically, the foregoing types include an adhesive containing at least one of an oxide of Al and an oxide of Si. Such an inorganic adhesive has not only a sufficient adhering strength but also high heat resistance. Consequently, as described below, various heat treatments can be given to a joined body in which a reinforcing material is joined to a plate material and a formed body in which the plate material of a joined body has been subjected to the below-described plastic working.

Hot Cladding

Hot cladding is a method of joining together joined parts to be joined by heating and pressing them. Usually, a metal thin film is formed on the joining surface of at least one of the plate material and the reinforcing material to be joined together. It is desirable that the metal thin film be composed of a metal that has a higher plastic deformability than that of the magnesium alloy. More specifically, the types of metal include at least one of Cu, Fe, and Ni. It is desirable that the metal thin film have a thickness of 0.1 to 10 μm or so. When the thickness is less than 0.1 μm, it is difficult to achieve sufficient joining strength. When the thickness is more than 10 μm, this condition only increases the thickness of the metal thin film excessively and it is difficult to increase the joining strength further. The types of means of forming the metal thin film include film formation by plating, physical vapor deposition, and chemical vapor deposition. Of these means, plating is more suitable. The types of concrete method of plating include electroplating and electroless plating.

At the time of the performing of hot cladding, it is desirable that the objects to be joined be heated at a temperature of 80° C. or more and 350° C. or less. When the temperature is less than 80° C., it is difficult to join the plate material and the reinforcing material together. When the temperature is more than 350° C., problems are sometimes occurred, such as the coarsening of the crystal grain of magnesium. It is desirable that the pressure welding be performed at a pressure of 20 to 80 MPa or so. When the pressure is less than 20 MPa, it is difficult to join the plate material and the reinforcing material together with sufficient strength. When the pressure is more than 80 MPa, the expectation of increasing the joining strength is less likely to be fulfilled.

Welding

Welding joins the plate material and the reinforcing material together by melting their joining surfaces. More specifically, spot welding is suitable for this purpose. Because the object to which the reinforcing material is joined is a plate material having a relatively simple shape, the welding operation can be performed easily. In the case of welding, it is not necessary to form the above-described joining layer separately in addition to the plate material and the reinforcing material.

Pretreatment

Before performing the joining together of the plate material and the reinforcing material, it is desirable that the objects to be joined be subjected to degreasing treatment. The degreasing treatment enables firm joining together of the objects to be joined.

Plastic-Working Step

In the plastic-working step, the type of the plastic working is not particularly limited provided that the plastic working is a plate formation that forms the plate material. The types of plastic working include, for example, deep drawing, bulging, and bending. It is desirable that these plastic-working steps be performed such that in the plate material, the plastic deformation is implemented in the region where the reinforcing material is not present. For example, as shown in FIGS. 1A and 1B, when a tray-shaped formed body is produced that has a rectangular bottom plate and a side plate extending from each side of the bottom plate, a rectangular blank plate (the plate material 1) is used and the reinforcing material 2 is joined only to the blank plate's portion to form the bottom plate of the tray after the forming. At the time of the forming, the forming tool, such as a punch and die, is required to have a notch to avoid interference with the reinforcing material 2.

It is desirable that the plastic-working step be performed in a temperature range of 150° C. to 300° C. so that the plastic deformability of the object to be processed can be increased. When the plastic-working step is performed in the foregoing temperature range, the object to be processed will be less likely to develop a crack and other defects caused by the plastic deformation.

Heat Treatment

It is desirable that heat treatment be given to the joined body in which a reinforcing material is joined to a plate material and the formed body in which the plate material of the joined body has been subjected to the above-described plastic working. Because an inorganic additive usually contains an organic solvent and water, it is desirable to perform heat treatment in order to remove the organic solvent and water. The removal of the organic solvent enables the joining layer to be composed practically of inorganic material alone. The removal of water can increase the corrosion resistance in the vicinity of the joining layer. It is desirable that the joined portion of the plate material and reinforcing material be heat-treated at a temperature of 80° C. or more and 350° C. or less. The heat treatment temperature of 80° C. or more enables the sufficient removal of the organic solvent and water in a short time. The heat treatment temperature of 350° C. or less prevents the deformation owing to the softening of the magnesium alloy and suppresses the strength reduction resulting from the coarsening of the crystal grain diameter of the magnesium alloy. A long heat-treating time, during which the foregoing heat treatment temperature is maintained, can sufficiently remove the organic solvent. Nevertheless, if the treating time is excessively long, the productivity of the alloy joined part is decreased. Consequently, it is desirable that the treating time be 30 minutes or less, particularly 5 minutes or less or so. Whether the joining layer is composed practically of inorganic material alone can be confirmed, for example, by detecting, with gas chromatography or the like, the presence or absence of a gas generated at the time of the heating of the joined body including the joining layer.

On the other hand, when the joining together of the plate material and reinforcing material is performed by hot cladding or welding, an organic solvent and the like are not used fundamentally. Consequently, the heat treatment for removing an organic solvent and the like can be omitted.

In addition, the formed body after the above-described plastic working may be subjected to heat treatment to remove the strain produced at the time of the plastic working.

Magnesium Alloy Joined Part

The magnesium alloy joined part of the present invention is obtained through the above-described production method of the present invention. In other words, the alloy joined part is provided with a plate material and a reinforcing material joined to the plate material, and the joined portion does not have a remaining organic material. The plate material is provided with a plastically deformed portion.

This magnesium alloy joined part may be provided with an anticorrosion coating or a film of painting. The providing of at least one of them can not only increase the corrosion resistance but also render the appearance of the alloy joined part good.

In particular, it is desirable that 99 weight % or more of the magnesium alloy joined part, except for the foregoing anticorrosion coating and a film of painting, be composed of magnesium alloy. This composition can avoid an excessive enlargement of the joining layer formed of an inorganic material.

It is desirable that the magnesium alloy joined part of the present invention be composed of a magnesium alloy having an average crystal grain diameter of 40 µm or less, more desirably 20 µm or less, preferably 10 µm or less. The use of a magnesium alloy having an extremely small average crystal grain diameter as described above can increase the strength of the plate material and reinforcing material.

Furthermore, in the magnesium alloy joined part of the present invention, joined parts other than the reinforcing material may be joined to the plate material. As shown in FIGS. 1A and 1B, joined parts other than the reinforcing material include a boss 3 and a pin 4. In particular, an internal thread may be formed at the inner surface of the boss 3, which has the shape of a hollow cylinder, so that an external thread can be screwed into the internal thread. When a protruding part such as the pin 4 is joined, the protruding portion can be used to align the plate material 1 provided with the reinforcing material 2 with another joined part at the time they are combined. When joined parts other than the reinforcing material are joined, also, it is desirable to employ a method that does not allow the organic material to remain, as described above.

Example 1

Housing cases of Example of the present invention and Comparative example were produced by joining a reinforcing material to a plate material to evaluate them.

Plate Material (the Base Plate of a Housing Case)

A plurality of cast plates (thickness: 4 mm) were prepared that were obtained by a twin-roll continuous-casting process. The cast plates were composed of magnesium alloys having a composition equivalent to that of AZ31 alloy Mg-3.0 mass % Al-1.0 mass % Zn), AZ61 alloy Mg-6.0 mass % Al-1.0 mass % Zn), or AZ91 alloy (Mg-9.0 mass % Al-1.0 mass % Zn). Each obtained cast plate was subjected to a plurality of times of rolling until its thickness reached 0.5 mm under the following rolling conditions: roll temperature: 150° C. to 250° C.; plate temperature: 200° C. to 400° C.; and rolling reduction per pass: 10% to 50%. The obtained rolled plate was subjected to die-cutting processing to prepare a blank plate (plate material) for the press forming. The plate material had a width of 200 mm and a length of 300 mm. The plate material was not subjected to anticorrosion treatment or painting.

Reinforcing Material (Rib)

Next, reinforcing materials were prepared by the method described below. A rectangular plate having a thickness of 0.6 mm, a width of 10 mm, and a length of 150 mm was die-cut from a rolled plate made of the above-described material having a composition equivalent to that of AZ91. Two types of reinforcing materials were prepared: one was a flat-plate reinforcing material formed of the foregoing rectangular plate without further processing, and the other was an L-shaped reinforcing material formed by bending the rectangular plate into an L shape. The L-shaped reinforcing material had a joining portion that was to be joined to the plate material and that had a width of 8 mm and a protruding portion that protruded from the surface of the plate material in a direction perpendicular to the surface when the reinforcing material was joined to the plate material and that had a height of 2 mm. When the longitudinal length of the reinforcing material was denoted as Lr and the length of the plate material in a direction along the reinforcing material was denoted as Lb, Lr=150 mm and Lb=180 mm, and the ratio of the lengths of the two materials, Lr/Lb, was 0.83. The difference in thermal expansion coefficient between AZ91 and AZ31 or AZ61 was $2 \times 10^{-6}$/K or less. The reinforcing material was not subjected to anticorrosion treatment or painting.

Joining Method

The above-described plate material and reinforcing material were joined together by four different methods described below. In all of the methods, the reinforcing material was joined in a direction along the width of the plate material.

(1) Inorganic Adhesive

An inorganic adhesive was applied to the reinforcing material's joining surface to be joined to the plate material. The joining surface was pressed against the plate material, so that they were joined together. The inorganic adhesive used was the heat-resistant inorganic adhesive Three Bond 3732 made by Three Bond Co., Ltd. The adhesive was composed mainly of aluminum oxide. After the reinforcing material was joined to the plate material, the joined body was subjected to heat treatment to remove an organic solvent (an alcohol-based solvent) in the inorganic adhesive. The heat treatment was conducted at 200° C. for 20 minutes.

(2) Sheet-Shaped Organic Adhesive

A sheet-shaped organic adhesive was affixed to the reinforcing material's joining surface to be joined to the plate material. The joining surface was pressed against the plate material, so that they were joined together. The sheet-shaped organic adhesive used was Three Bond 1600 made by Three Bond Co., Ltd.

(3) Spot Welding

The joining surface of the reinforcing material was placed at a predetermined position on the plate material to perform spot welding. In this case, the spot welding was performed at three locations at the joining surface of the reinforcing material.

(4) Hot Cladding

Cu plating and Ni strike plating were performed successively on the reinforcing material through electroplating. The plated surface of the reinforcing material was pressed against the plate material to conduct pressure welding at a pressure of 60 MPa in an atmosphere at about 300° C. The total thickness of the Cu plating and Ni strike plating was 2.5 µm.

Plastic Working

Plastic working was conducted on the joined body formed by the joining through the method described above. In this case, the joined body was transformed into the shape of a tray having a depth of drawing of 10 mm through the press working. The press working was performed by using a punch having a shape that does not interfere with the reinforcing material. The press working was performed as a warm working by heating the joined body at 280° C.

Evaluation Method

The obtained joined body was subjected to a deflection test. A test specimen having dimensions of 150 mm by 30 mm was cut from the joined body obtained as described above such that the reinforcing material was included. A load of 1 kg was applied to one point of the test specimen to measure the amount of deflection of the test specimen. When the amount of deflection was 5 mm or less, the specimen was judged to be satisfactory. When more than 5 mm, the specimen was judged to be unsatisfactory. The test results are summarized in Table I.

TABLE I

| | Plate material | | | | | |
|---|---|---|---|---|---|---|
| | AZ31 | AZ31 | AZ61 | AZ91 | AZ91 | AZ91 |
| | | | Reinforcing material | | | |
| | Not used | AZ91 Flat plate | AZ91 L-shaped rib | AZ91 Flat plate | AZ91 Two flat plates | AZ91 L-shaped rib |
| Evaluation | Not joined/ Unsatisfactory/ 9.5 | Method(1)/ Satisfactory/ 1.6 Method(2)/ Unsatisfactory/*1 Method(3)/ Unsatisfactory/*2 Method(4)/ Satisfactory/ 1.6 | Method(1)/ Satisfactory/ 0.5 Method(2)/ Unsatisfactory/*1 Method(3)/ Unsatisfactory/*2 Method(4)/ Satisfactory/ 0.5 | Method(1)/ Satisfactory/ 1.5 Method(2)/ Unsatisfactory/*1 Method(3)/ Unsatisfactory/*2 Method(4)/ Satisfactory/ 1.5 | Method(1)/ Satisfactory/ 0.5 Method(2)/ Unsatisfactory/*1 Method(3)/ Unsatisfactory/*2 Method(4)/ Satisfactory/ 0.5 | Method(1)/ Satisfactory/ 0.3 Method(2)/ Unsatisfactory/*1 Method(3)/ Unsatisfactory/*2 Method(4)/ Satisfactory/ 0.3 |

Evaluation: Joining method/Judgment/Amount of deflection (mm)
*1: Evaluation was impossible because the joined portion was separated at the time of the plastic working.
*2: Appearance was unsatisfactory.

As can be seen from Table I, the use of the L-shaped rib reduces the amount of deflection in comparison with the use of two flat plate-shaped ribs. In other words, the use of the L-shaped rib exercises a higher reinforcing effect than an about threefold increase in the thickness of the plate material. After the curing, the inorganic adhesive had the following properties: thermal expansion coefficient: $75 \times 10^{-7}$/K; and Vickers hardness (0.2 kgf): 200 Hv. The mass percentage of the magnesium alloy in the test specimen was as follows: the test specimen formed by using a sheet-shaped organic adhesive: less than 99%; the test specimen formed by using an inorganic adhesive or by hot cladding: 99% or more; and the test specimen formed by spot welding: 100%. The magnesium alloy forming the test specimen had an average crystal grain diameter of 20 μm or less.

Example 2

Figure 2:
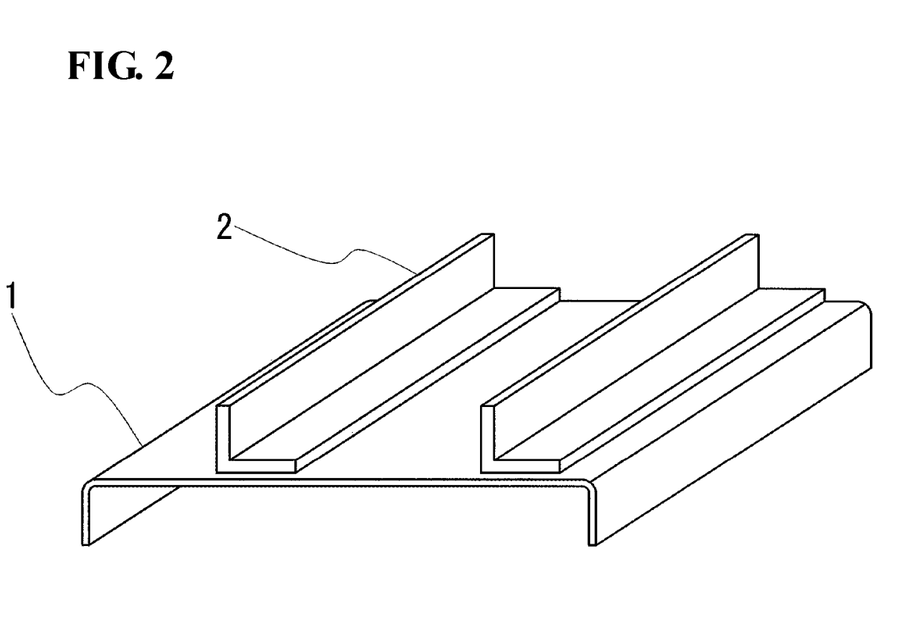
FIG. 2 is a perspective view showing the magnesium alloy joined part in Example 2.

As shown in FIG. 2, a reinforcing material 2, which had a composition equivalent to that of AZ91, was joined to a plate material 1, which had a composition equivalent to that of AZ91 (thermal expansion coefficient: about $27.2 \times 10^{-6}$/K) or AZ31 (thermal expansion coefficient: about $26.8 \times 10^{-6}$/K), to produce the below-described samples. The individual samples underwent examinations of recyclability, heat resistance, appearance, production time, and corrosion resistance. The sample was composed of a plate material 1, which was produced by bending both end portions at nearly a right angle to obtain the shape shown by the sign 1 in FIG. 2, and a reinforcing material 2 that had an L-shaped cross section and that was joined to the plate material 1 at its top surface. In this case, the reinforcing material 2 was joined to the plate material 1 in the direction along the width of the plate material 1. The plate material before being bent had the following size: width: 150 mm; length: 300 mm; and thickness: 0.5 mm. The reinforcing material 2 had the same shape and size as those of the L-shaped reinforcing material used in Example 1. When the longitudinal length of the reinforcing material 2 was denoted as Lr and the length of the plate material 1 in a direction along the reinforcing material 2 was denoted as Lb, Lr=150 mm and Lb=150 mm, and the ratio of the lengths of the two materials, Lr/Lb, was 1.0. The joining methods are described below. Of these joining methods, in the joining by the use of an inorganic adhesive (Three Bond 3732), heat treatment was conducted at 200° C. for 20 minutes to remove an organic solvent in the inorganic adhesive. At the press working, the temperature of the object to be processed was 280° C.

Samples

Sample 2-1: After the plate material made of AZ91 was press-formed into the shape of a tray, the reinforcing material was joined to the press-formed body by using the inorganic adhesive.

Sample 2-2: After the plate material made of AZ91 was press-formed into the shape of a tray, the reinforcing material was joined to the press-formed body by using the organic adhesive.

Sample 2-3: After the plate material made of AZ91 was press-formed into the shape of a tray, the reinforcing material was joined to the press-formed body through the spot welding.

Sample 2-4: After the reinforcing material was joined to the plate material made of AZ91 by using the inorganic adhesive, the plate material of the joined body was press-formed into the shape of a tray.

Sample 2-5: After the reinforcing material was joined to the plate material made of AZ91 by using the organic adhesive, the plate material of the joined body was press-formed into the shape of a tray.

Sample 2-6: After the reinforcing material was joined to the plate material made of AZ91 through the spot welding, the plate material of the joined body was press-formed into the shape of a tray.

Sample 2-7: After the reinforcing material was joined to the plate material made of AZ31 by using the inorganic adhesive, the plate material of the joined body was press-formed into the shape of a tray.

Sample 2-8: After the reinforcing material was joined to the plate material made of AZ91 through the hot cladding, the plate material of the joined body was press-formed into the shape of a tray. The condition for the hot cladding was the same as that of Example 1.

Sample 2-9: After the reinforcing material made of A1050 aluminum alloy (thermal expansion coefficient: $25 \times 10^{-6}$/K) was joined to the plate material made of AZ91 by using the inorganic adhesive, the plate material of the joined body was press-formed into the shape of a tray.

Sample 2-10: After the reinforcing material made of SUS410 (thermal expansion coefficient: $10.4 \times 10^{-6}$/K) was joined to the plate material made of AZ91 by using the inorganic adhesive, the plate material of the joined body was press-formed into the shape of a tray.

Evaluation Method

The above-described samples underwent the following evaluations. The results are summarized in Table II.

Recyclability: The sample formed of the joined body was pulverized into small particles, put into a carbon crucible, and melted in an Ar atmosphere. The composition before and after the melting was analyzed through atomic-emission spectrometry with inductively coupled plasma (ICP) to examine the state of variation in composition. When the sample had unusual odor resulting from the generation of gas during the melting or showed a variation in composition, the sample was judged to be unsatisfactory. The sample free from these undesirable results was judged to be satisfactory. In addition, when the magnesium alloy obtained by melting contained 100 ppm or more Fe, the sample was judged to be unsatisfactory because its corrosion resistance decreases considerably.

Heat resistance: A test specimen of a cube of 2 cm on its side was cut from the joined body such that the joined portion was included. The test specimen was maintained in an environment at 150° C. for 100 hours to examine the presence or absence of the separation at the joined portion. When the separation was absent, the sample was judged to be satisfactory. When the separation was present, the sample was judged to be unsatisfactory.

Appearance: The appearance was inspected by visually observing the joined portion to examine, for example, the presence or absence of a weld nodule. When a weld nodule was absent, the sample was judged to be satisfactory. When a weld nodule was present, the sample was judged to be intermediate in quality between satisfactory and unsatisfactory. In addition, at a randomly sampled flat portion in a sample, when the amount of curling was less than $(0.005 \times Lr)$ mm, where $Lr$ is the length of the reinforcing material, the sample was judged to be satisfactory. When the amount of curling was $(0.005 \times Lr)$ mm or more, the sample was judged to be unsatisfactory.

Production time: The time for producing 100 joined bodies was measured to calculate the production time (second) per joined body. In this case, the time of heat treating for removing the organic solvent from the inorganic adhesive was excluded from the production time for the joined body because the time of heat treating was long.

Corrosion resistance: A test specimen of a cube of 2 cm on its side was cut from the joined body such that the joined portion was included. The test specimen was subjected to a salt spray test for 24 hours to examine the state of corrosion. When no corrosion was recognized, the sample was judged to be satisfactory. When corrosion was recognized, the sample was judged to be unsatisfactory.

As can be seen from Table II, the production time is shorter when the reinforcing material is joined to the plate material before the pressing than when the plate material is press-formed before the reinforcing material is joined. The sample formed by using an inorganic adhesive showed good results in all of the recyclability, heat resistance, appearance, and production time.

INDUSTRIAL APPLICABILITY

The method of the present invention for producing a magnesium alloy joined part can be suitably applied to the production of a magnesium alloy joined part that has excellent rigidity in spite of having a thin wall.

In addition, the magnesium alloy joined part of the present invention can be suitably applied, for example, to the housing case of an electronic device.

EXPLANATION OF SIGNS

1: plate material
2: reinforcing material
3: boss
4: 4 pin

| Explanation of Signs | |
|---|---|
| 1: | plate material |
| 2: | reinforcing material |
| 3: | boss |
| 4: | 4 pin |

CITATION LIST

Patent Literature

Patent Literature 1: the published Japanese patent application Tokukai 2002-018626

The invention claimed is:

1. A method of producing a magnesium alloy joined part, the method comprising steps of:
    joining at least one member selected from group consisting of a reinforcing material, a boss, and a pin, all made of metal, to a rolled plate comprised of a magnesium alloy without allowing an organic material to remain at the joined portion; and

TABLE II

| Sample | Recyclability | Heat resistance | Appearance | Production time (sec) | Corrosion resistance |
|---|---|---|---|---|---|
| 2-1 | Satisfactory | Satisfactory | Satisfactory | 3 | Satisfactory |
| 2-2 | Unsatisfactory | Unsatisfactory | Satisfactory | 3 | Satisfactory |
| 2-3 | Satisfactory | Satisfactory | Intermediate in quality between satisfactory and unsatisfactory | 20 | Satisfactory |
| 2-4 | Satisfactory | Satisfactory | Satisfactory | 1 | Satisfactory |
| 2-5 | Unsatisfactory | Unsatisfactory | Separation of organic adhesive occurred at the time of press forming. | | |
| 2-6 | Satisfactory | Satisfactory | Intermediate in quality between satisfactory and unsatisfactory | 10 | Satisfactory |
| 2-7 | Satisfactory | Satisfactory | Satisfactory | 1 | Unsatisfactory |
| 2-8 | Satisfactory | Satisfactory | Satisfactory | 300 | Satisfactory |
| 2-9 | Satisfactory | Satisfactory | Satisfactory | 1 | Satisfactory |
| 2-10 | Unsatisfactory | Unsatisfactory | Unsatisfactory | 1 | Unsatisfactory | performing plastic working on the rolled plate having undergone the joining step in a temperature range of 150° C. to 300° C., wherein the joining is performed by forming a joining layer, and the joining layer comprises an inorganic material and does not include organic material, wherein a difference in a thermal expansion coefficient between the reinforcing material and the roller plate is between $0.4\times10^{-6}$/K and $10\times10^{-6}$/K, and wherein the inorganic material includes an adhesive comprising at least one member selected from the group consisting of an oxide of Al and an oxide of Si.

2. The method according to claim 1, wherein:

the height of the reinforcing material protruding from a surface of the rolled plate is at least two times the thickness of the rolled plate, and when the longitudinal length of the reinforcing material is denoted as Lr and the length of the rolled plate in a direction along the reinforcing material is denoted as Lb, the ratio of the length of the two materials, Lr/Lb, is 0.8 or more.

3. The method according to claim 1, wherein the plastic-working step selected from deep drawing, bulging, or bending.

4. The method according to claim 1, wherein the joining step further comprises:

performing a heat treatment in which the joined portion is heated at 80° C. to 350° C.

5. The method according to claim 4, wherein the joining step further comprises:

pressing the reinforcing material and the rolled plate at a pressure of 20 to 80 MPa.

6. The according to claim 1, wherein the difference in the thermal expansion coefficient between the reinforcing material and the roller plate is between $0.4\times10^{-6}$/K and $2.2\times10^{-6}$/K.

7. The method according to claim 1, wherein the inorganic material contains at least one member selected from the group consisting of Al, Si, Cu, Fe, and Ni.

8. A method of producing a magnesium alloy joined part, the method comprising steps of:

joining at least one member selected from group consisting of a reinforcing material, a boss, and a pin, all made of metal, to a rolled plate comprised of a magnesium alloy without allowing an organic material to remain at the joined portion; and performing plastic working on the rolled plate having undergone the joining step in a temperature range of 150° C. to 300° C., wherein the joining is performed by forming a joining layer, and the joining layer comprises an inorganic material and does not include organic material, wherein a difference in a thermal expansion coefficient between the reinforcing material and the roller plate is between $0.4\times10^{-6}$/K and $10\times10^{-6}$/K, and wherein the inorganic material is comprised mainly of aluminum oxide.

* * * * *